(12) United States Patent
Bergfeld

(10) Patent No.: US 9,132,509 B2
(45) Date of Patent: Sep. 15, 2015

(54) METHOD AND APPARATUS FOR ENGRAVING A FLEXIBLE STRIP WITH PIVOTING A PROCESSING HEAD ABOUT A LONGITUDINAL AXIS OF A CYLINDER

(71) Applicant: 4JET Technologies GmbH, Alsdorf (DE)

(72) Inventor: Stefan Bergfeld, Aachen (DE)

(73) Assignee: 4JET Technologies GmbH, Alsdorf (DE)

( * ) Notice: Subject to any disclaimer, the term of this patent is extended or adjusted under 35 U.S.C. 154(b) by 307 days.

(21) Appl. No.: 13/865,263

(22) Filed: Apr. 18, 2013

(65) Prior Publication Data

US 2014/0144894 A1 May 29, 2014

Related U.S. Application Data

(63) Continuation of application No. PCT/EP2011/066325, filed on Sep. 20, 2011.

(30) Foreign Application Priority Data

Oct. 19, 2010 (DE) .......................... 10 2010 038 259

(51) Int. Cl.
*B41M 5/24* (2006.01)
*B41M 5/26* (2006.01)
(Continued)

(52) U.S. Cl.
CPC ............... *B23K 26/365* (2013.01); *B23K 26/00* (2013.01); *B23K 26/0676* (2013.01); *B23K 26/0807* (2013.01); *B23K 26/0846* (2013.01); *B23K 26/36* (2013.01); *B23K 26/367* (2013.01); *B41F 17/00* (2013.01); *B41F 17/08* (2013.01); *B41M 5/24* (2013.01); *B41M 5/26* (2013.01); *H01L 31/18* (2013.01); *B23K 26/0066* (2013.01); *B23K 2201/16* (2013.01); *B23K 2201/40* (2013.01); *H01L 51/0023* (2013.01); *H01L 51/442* (2013.01)

(58) Field of Classification Search
CPC ........... B41M 5/24; B41M 5/26; B41F 17/00; B41F 17/08; B23K 26/0066; B23K 26/36; B23K 26/365
USPC ........ 216/11, 13, 52, 94; 29/825; 219/121.68, 219/121.69; 136/243, 244
See application file for complete search history.

(56) References Cited

U.S. PATENT DOCUMENTS

2004/0159637 A1   8/2004   Herke et al.
2007/0240325 A1*  10/2007  Pelsue et al. .................... 33/707

FOREIGN PATENT DOCUMENTS

DE   102007034644 A1   1/2009
JP        60177985 A    9/1985
(Continued)

*Primary Examiner* — Samuel M Heinrich
(74) *Attorney, Agent, or Firm* — Von Rohrscheidt Patents

(57) ABSTRACT

A method and a device for engraving a flexible strip, the device including a drive device for moving a flexible strip in a longitudinal direction of the flexible strip; a support device for supporting the strip in a circumferential direction of a cylinder on a surface segment of the cylinder acting as a support surface; a processing head oriented towards the support surface for engraving the strip with at least one tool oriented towards the support surface; and a drive device for moving the processing head, wherein the processing head is pivotable through the drive device about a longitudinal axis of the cylinder. In order to engrave a closed loop with a single processing head it is proposed that the processing head is pivotable through a drive device about a longitudinal axis of the cylinder.

7 Claims, 2 Drawing Sheets

(51) Int. Cl.
*B41F 17/00* (2006.01)
*B41F 17/08* (2006.01)
*B23K 26/36* (2014.01)
*B23K 26/067* (2006.01)
*B23K 26/08* (2014.01)
*H01L 31/18* (2006.01)
*B23K 26/00* (2014.01)
*H01L 51/00* (2006.01)
*H01L 51/44* (2006.01)

(56) References Cited

FOREIGN PATENT DOCUMENTS

| | | |
|---|---|---|
| JP | 10027918 A | 1/1998 |
| JP | 2001265414 A | 9/2001 |
| JP | 2003334673 | 11/2003 |
| JP | 2013534228 | 9/2013 |
| WO | WO2008149949 | 12/2008 |

* cited by examiner

METHOD AND APPARATUS FOR ENGRAVING A FLEXIBLE STRIP WITH PIVOTING A PROCESSING HEAD ABOUT A LONGITUDINAL AXIS OF A CYLINDER

RELATED APPLICATIONS

This application is a continuation of PCT/EP2011/066325, filed on Sep. 20, 2011, claiming priority from German patent application DE 10 2010 038 259.0, filed on Oct. 19, 2010, both of which are incorporated in their entirety by this reference.

FIELD OF THE INVENTION

The invention relates to a method and a device for engraving a flexible strip, including a feed device for moving the strip in a longitudinal direction of the strip, a support device for supporting the strip in a circumferential direction of a cylinder through a surface segment of the cylinder configured as support surface, a processing head oriented towards the support surface for engraving the strip through at least one tool oriented towards the support surface and a drive device for moving the processing head.

BACKGROUND OF THE INVENTION

Methods and devices of the general type recited supra are used in particular to structure flexible solar modules which are provided as a multi-layer strip on rollers in a continuous process. Through a laser beam used as a tool, one or plural functional layers of the strip are removed in order to separate particular solar cells from one another or from edge portions of the roller material or in order to prepare grooves for conductive paths.

A method and a device of the general type recited supra is known from JP 10-279 18 A. The processing head of the device proposed therein is movable along a longitudinal axis of a cylinder.

BRIEF SUMMARY OF THE INVENTION

Technical Object

It is an object of the invention to engrave a closed curve with a single processing head.

Solution

Improving upon a known method, it is proposed according to the invention that a processing head is pivotable through a drive device about a longitudinal axis of a cylinder. Thus, the processing head is movable in a particularly simple manner at a constant distance from a support surface in a circumferential direction and/or in a longitudinal direction of the cylinder. Through the movement of the processing head in the circumferential direction with constant feeding of the strip from the roll, the feeding of the tool on the strip is locally accelerated or slowed down. When using a laser beam as a tool, the engraving is weakened or intensified accordingly for a constant laser power. In combination with moving the processing head in a longitudinal direction of the cylinder, any types of engravings are facilitated, like for example transversal lines or also loop shaped tracks. Engravings of any type can also be performed with locally constant power input while simultaneously adapting the laser power or with variable feeding from the roller.

The object is advantageously achieved by A method for engraving a flexible strip, including the steps: moving a flexible strip in a longitudinal direction of the flexible strip and in a circumferential direction of a cylinder on a surface segment of the cylinder acting as a support surface; and engraving the flexible strip with at least one tool oriented from a processing head towards the support surface, wherein the processing head is pivoted over the support surface about a longitudinal axis of the cylinder.

The object is also advantageously achieved by a device for engraving a flexible strip, the device including: a drive device for moving a flexible strip in a longitudinal direction of the flexible strip; a support device for supporting the flexible strip in a circumferential direction of a cylinder on a surface segment of the cylinder acting as a support surface; a processing head oriented towards the support surface for engraving the strip with at least one tool oriented towards the support surface; and a drive device for moving the processing head, wherein the processing head is pivotable through the drive device about a longitudinal axis of the cylinder.

In an advantageous embodiment of the method according to the invention, the tool is a laser beam. Alternatively, the at least one tool can also be a needle for mechanically scratching the strip.

Particularly advantageously, the laser beam is initially run in a longitudinal axis of the cylinder in a method according to the invention and then deflected in a radial direction and then deflected in a longitudinal direction of the cylinder and then deflected in the processing head onto the support surface. Through the initial beam orientation in the longitudinal axis of the cylinder, a deflection into a plane of a processing head that is pivotable about the longitudinal axis is simplified. For this purpose, only a single deflection element is required that is permanently connected with the pivoted unit. The processing head can be pivoted without having to actively adjust the laser beam. Through the beam orientation in radial direction, a deflection into the plane of a radially adjustable processing head is simplified. During radial adjustment only the distance to the next deflection element is increased. Through the subsequent beam routing in a longitudinal direction of the cylinder in a plane of a processing head that is adjustable in a longitudinal direction, a deflection onto the support surface is facilitated. During adjustment in the longitudinal direction in turn only the distance to the next deflection element is increased. Depending on particular requirements the three variants of routing the laser beam can also be used individually in a method according to the invention.

In a particularly advantageous embodiment of a method according to the invention, a plurality of the laser beams in the processing head is divided and oriented in parallel onto the support surfaces. Through dividing the laser beams, for example according to the principle that is know from DE 2007 034 644 A1, all laser beams can be generated in a common light source and the generation can be controlled in a particularly simple manner. Alternatively, several of the laser beams can for example be separately generated in the processing head and controlled separately.

Improving upon the known device, it is proposed according to the invention that the processing head (5) is pivotable through the drive device about a longitudinal axis (15) of a cylinder (2). A device according to the invention facilitates performing a method according to the invention and is characterized by the advantages recited for the method.

Preferably the cylinder is supported rotatable about a longitudinal axis of the cylinder in a device according to the invention. In a device of this type, the cylinder can either be driven by the strip or the cylinder can drive the strip. The circumferential velocity then essentially corresponds to the feed velocity of the strip. Thus, the strip is run over the support surface in a particularly gentle manner, wherein the support surface migrates over the surface of the cylinder with circumferential velocity. Damages through scratching a bottom side of the strip are thus prevented.

With a device of this type according to the invention, more complex geometric figures can be engraved into the strip. Any patterns can be generated on the continuously moving strip as long as the pattern in strip direction is not longer than half the contact surface on the cylinder. For example a pattern of rectangles can be generated so that each rectangle encloses an area without gaps, thus each tool of a processing head can generate an identical pattern in one processing step.

Patterns of this type are relevant in particular for photovoltaic applications since coatings can be removed so that electrically separated portions, in particular rectangles remain.

For transversal lines in the circumferential direction of the cylinder, the head is moved faster in feed direction than the strip in one step and against the feed direction in another step. For the longitudinal lines in the longitudinal direction of the cylinder, the head is pivoted with the feeding velocity of the strip. Additionally, a movement is performed in a longitudinal direction of the cylinder. In particular a device of this type according to the invention includes drive elements for moving in a longitudinal direction and/or for moving in a radial direction of the cylinder. The distance of the processing head from the support surface can be adjusted through moving the processing head in the radial direction. This is important in particular when a laser beam is used as a tool when a strip with different thicknesses is processed and the laser spot diameter on the strip or the laser power imparted upon the strip shall be locally adapted.

In an advantageous embodiment of the device according to the invention, the tool is arranged at an angle of attack of 30° to 60° against the feed direction of the strip relative to an orthogonal on the support surface. When using a laser beam as a tool, the laser beam impacts the strip at this angle of attack. Thus material that chips off during engraving is not run back into the laser beam, in particular not heated, evaporated or fragmented in the laser beam and therefore does not influence further processing.

The cylinder surface is advantageously made from a material which is neither removed through laser radiation nor otherwise permanently influenced, nor does the material reflect the laser radiation back so that the reflected radiation influences the material to be processed in a negative manner.

BRIEF DESCRPTION OF THE DRAWINGS

The invention is subsequently described in more detail based on an advantageous embodiment with reference to drawing figures, wherein.

DETAILED DESCRPTION OF THE INVENTION

Figure 1:
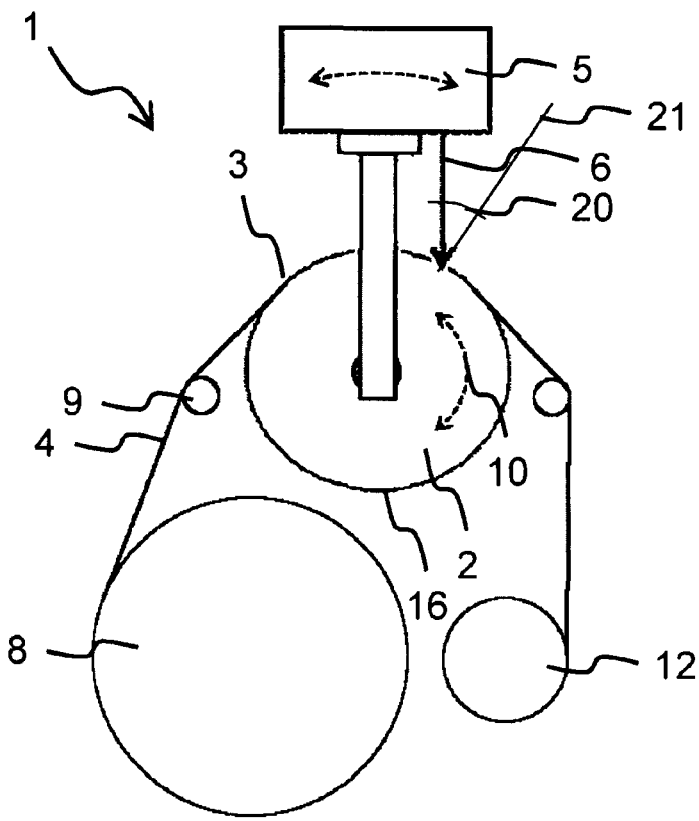
FIG. 1 illustrates a device according to the invention in a side view.
Figure 2:
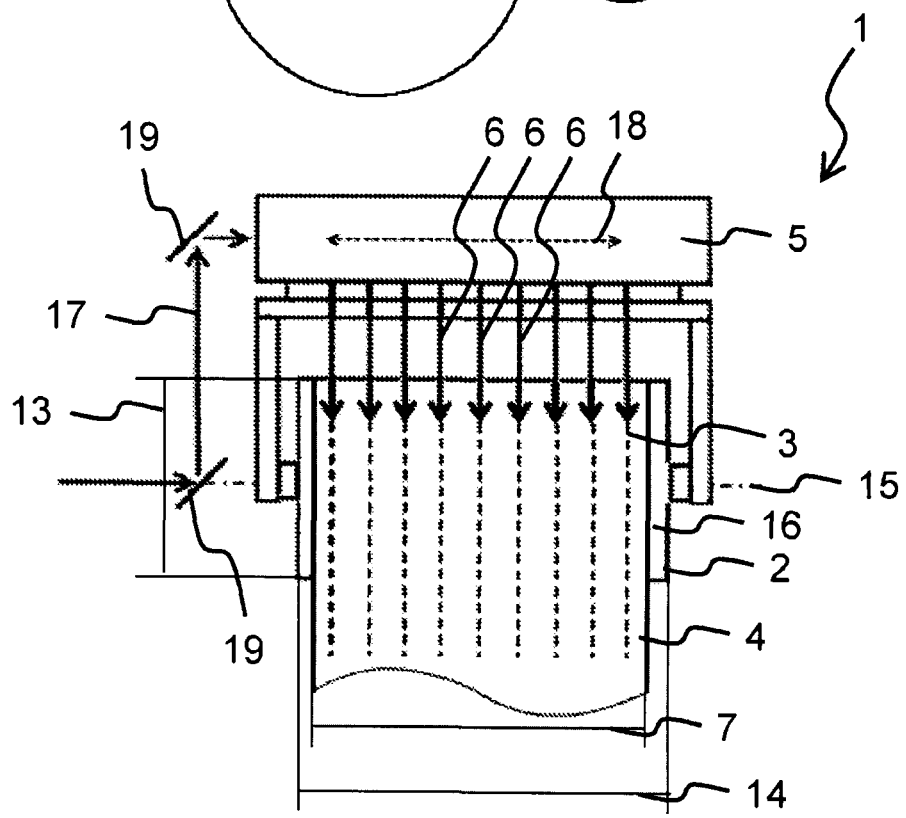
FIG. 2 illustrates the device according to the invention in a front view.

The device 1 according to the invention illustrated in FIGS. 1 and 2 includes a cylinder 2 with a support surface 3 for supporting a flexible strip 4 and a processing head 5 for engraving the strip 4 with nine laser beams configured as tools 6 routed in parallel onto the support surface 3. The strip 4 is a multilayer intermediary product with a width of 7 to 30 cm for producing solar modules and is rolled from a freewheeling first roller 8 over a support roller 9 supporting from below onto the support surface 3, run over the support surface 3 in a circumferential direction 10 of the cylinder 2 and after engraving the strip is wound over another support roller 11 supporting from below onto a driven second roller 12.

The cylinder 2 has a diameter 13 of 30 cm and a width 14 which exceeds the width of the intermediary product by 2 to 4 cm, is rotatably supported at the device 1 about a longitudinal axis 15 of the cylinder and is driven by the strip 4 like the support rollers 9, 11. The strip 4 is kept under slight tension through a non-illustrated brake at the first roller 8. The surface 16 of the cylinder 2 is coated ceramically and actively cooled.

The processing head 5 is also pivotably supported about the longitudinal axis 15 at the device 1 and provided with a pivot drive and a drive for moving in a radial direction 17 and in a longitudinal direction 18 of the cylinder 2. The pivot drive and the two additional modules of the processing head 5 are not illustrated.

The laser beams originate from a non illustrated pulsed infrared picosecond laser with a wavelength $\lambda$ of 1,030 or 1,064 nm at a pulse length between 5 and 20 picoseconds configured as a common light source, the laser beams are initially routed in the longitudinal axis 15 and then deflected through two mirrors 19 in a radial direction 17 and eventually deflected again in the longitudinal direction 18 of the cylinder 2. The laser beams are divided in the processing head 5 and run in parallel onto the support surface 3. In the processing head 5, the particular laser beams can be moved relative to one another with the non illustrated heads.

The laser beams are inclined against the feed direction of the strip 4 at an angle of attack of 20° to 45° relative to an orthogonal on the support surface 3. Thus, it is prevented that material removed from the strip 4 influences the laser beam and thus the processing, wherein the laser beam would heat up the chipped off material, evaporate it or crush it further and wherein fragments would be moved back onto the surface to be processed.

The device 1 according to the invention includes not illustrated gas nozzles for introducing compressed air, inert gas or process support gas proximal to an impact location of the laser beams on the strip 4. In a running process, the gas supports extracting the removed material from an area of the laser beam and from the surface of the strip 4. On another side of the laser beams, a suction opening extracts the removed material and the gas flowing in through the nozzles.

The device 1 according to the invention furthermore includes a non-illustrated detection sensor which detects structures on or at the foil, in particular edges, structures or markings which were applied in preceding processes. The device 1 according to the invention facilitates generating structures on the strip 4 which are precisely aligned with existing structures.

Eventually, the device 1 according to the invention includes a Galvo scanner in the processing head 5 which can perform for example an edge layer removal on the fly, thus during forward movement and transversal to the feed direction without changing a processing distance. During longer processing, heat introduced into the material can be removed through the roller.

The device 1 according to the invention is a pilot arrangement. A different device according to the invention can be used in production with intermediary materials in widths up to 150 cm, in particular 120 cm or other multiples of 30 cm. In another device according to the invention, a diameter of the cylinder 2 should not be selected smaller than 10 cm and not greater than 100 cm in order not to bend the intermediary product excessively on the one hand side and on the other hand side to keep a weight of the cylinder 2 within manageable limits.

Other devices according to the invention can include different laser parameters, in particular different wavelengths and pulse durations. For a layer system, different wavelengths are selected in order to maximize absorption in the layer to be removed and in order to simultaneously minimize absorption of the remaining material. The pulse duration can be used to influence a zone with heat impact in the edge portions of the processing. For very short pulses under 10 picoseconds absorption can be increased again in particular materials.

Figure 3A:
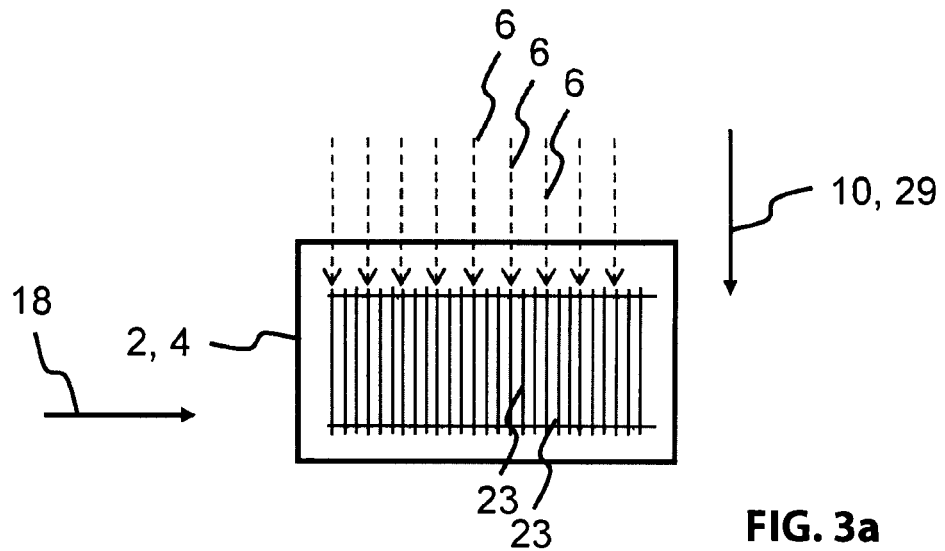
FIG. 3a illustrates a pattern that is engraveable with a device according to the invention.
Figure 3B:
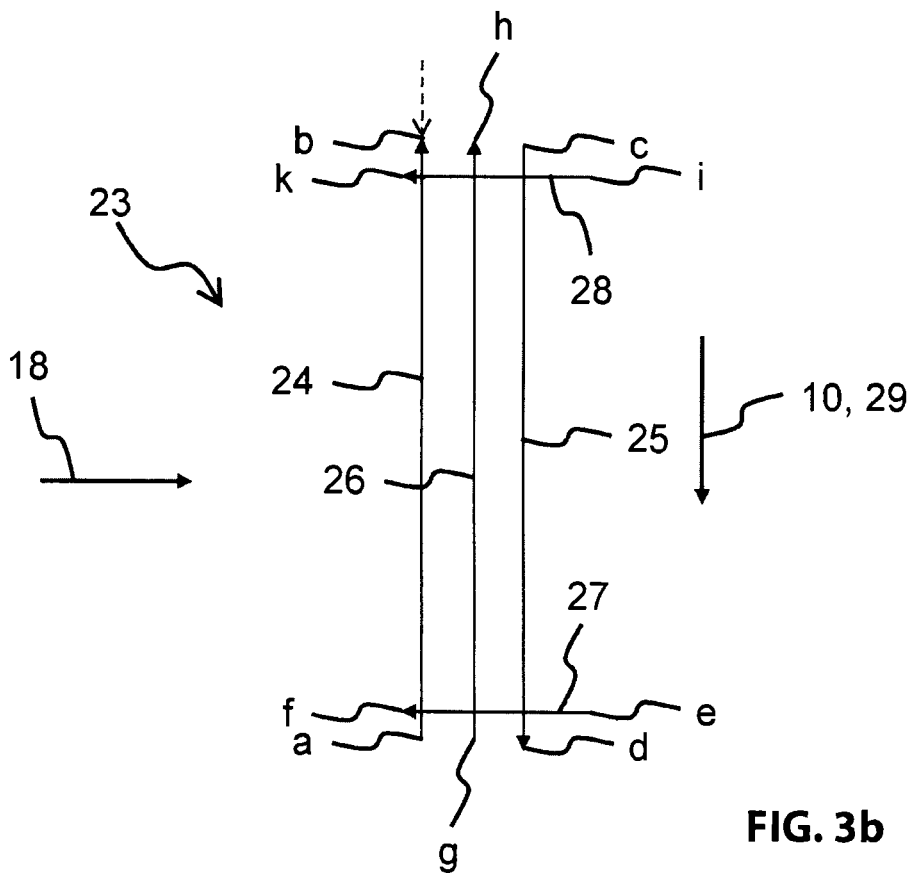
FIG. 3b illustrates a detail of the pattern.

FIG. 3a illustrates a pattern 22 that is engraveable with the device 1 according to the invention for a flexible module with monolithic wiring that is not illustrated. The pattern includes nine blocks 22 with three respective transversal lines 24, 25, 26 with equal distances in the circumferential direction 10 and two parallel longitudinal lines 27, 28 in a longitudinal direction 18 of the cylinder 2. Each block 23 is engraved with exactly one of the tools 6 according to the processing method illustrated in FIG. 3b. During processing, the strip 4 is continuously driven through the cylinder 2 in a feed direction 29.

Starting with a start point a on the moved strip, the tool 6 initially engraves the first transversal line 24 up to the second point b. The tool 6 then moves in idle mode to a third point c and engraves the second transversal line 25 from there to a fourth point d. The tool 6 then moves to a fifth point e in idle mode and engraves the first longitudinal line 27 from there to the sixth point f. In a next step, the tool 6 moves to a seventh point g in idle mode and engraves the third transversal line 26 to the eighth point h. Finally, the tool 6 moves to the ninth point j in idle mode and engraves the second longitudinal line 28 up to the tenth point k.

When engraving the first transversal line 24 at the third transversal line 26, the processing head 5 pivots with the tools 6 against the feed direction 29, when engraving the second transversal line 25 in the processing head pivots in feed direction 29. When engraving the longitudinal lines 27, 28 and during movement in idle mode between engravings, the processing head 5 pivots and simultaneously moves in or against the longitudinal direction of the cylinder 2. Subsequently, the processing head 5 moves the tools 6 to non-illustrated starting points a of a pattern 22 that is also not illustrated and arranged adjacent against the feed direction 29.

REFERENCE NUMERALS AND DESIGNATIONS 1 device
2 cylinder
3 support surface
4 strip
5 processing head
6 tool
7 width
8 roller
9 support roller
10 circumferential direction
11 support roller
12 roller
13 diameter
14 width
15 longitudinal axis
16 surface
17 radial direction
18 longitudinal direction
19 mirror
20 angle of attack
21 orthogonal
22 pattern
23 block
24 first transversal line
25 second transversal line
26 third transversal line
27 first longitudinal line
28 second longitudinal line
29 feed direction
a-k points

What is claimed is:

1. A method for engraving a flexible strip, comprising the steps:
    moving a flexible strip in a longitudinal direction of the flexible strip and in a circumferential direction of a cylinder on a surface segment of the cylinder acting as a support surface; and
    engraving the flexible strip with at least one tool oriented from a processing head towards the support surface,
    wherein the processing head is pivoted over the support surface about a longitudinal axis of the cylinder.

2. The method according to the preceding claim, wherein the at least one tool is a laser beam.

3. The method according to the preceding claim, wherein the laser beam is initially oriented in a longitudinal axis of the cylinder, then deflected in a radial direction of the cylinder, then deflected in a longitudinal direction of the cylinder, and deflected in the processing head onto the support surface.

4. The method according to claim 2,
    wherein the laser beam is divided in to a plurality of laser beams in the processing head, and
    wherein the plurality of laser beams is oriented towards the support surface in parallel.

5. A device for engraving a flexible strip, the device comprising:
    a drive device for moving a flexible strip in a longitudinal direction of the flexible strip;
    a support device for supporting the flexible strip in a circumferential direction of a cylinder on a surface segment of the cylinder acting as a support surface;
    a processing head oriented towards the support surface for engraving the strip with at least one tool oriented towards the support surface; and
    a drive device for moving the processing head,
    wherein the processing head is pivotable through the drive device about a longitudinal axis of the cylinder.

6. The device according to the preceding claim, wherein the cylinder is rotatably supported at the device about a longitudinal axis of the cylinder.

7. The device according to claim 5, wherein the at least one tool is inclined against a feed direction of the strip by an angle of 30° to 60° relative to an orthogonal on the support surface.

* * * * *